(12) United States Patent
Sarwer et al.

(10) Patent No.: US 10,728,557 B2
(45) Date of Patent: Jul. 28, 2020

(54) EMBEDDED CODEC CIRCUITRY FOR SUB-BLOCK BASED ENTROPY CODING OF QUANTIZED-TRANSFORMED RESIDUAL LEVELS

(71) Applicant: SONY CORPORATION, Tokyo (JP)

(72) Inventors: Mohammed Golam Sarwer, San Jose, CA (US); Ali Tabatabai, San Jose, CA (US)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/169,477

(22) Filed: Oct. 24, 2018

(65) Prior Publication Data

US 2020/0137402 A1    Apr. 30, 2020

(51) Int. Cl.
| | |
|---|---|
| *H04N 19/18* | (2014.01) |
| *H04N 19/117* | (2014.01) |
| *H04N 19/126* | (2014.01) |
| *H03M 7/42* | (2006.01) |
| *H04N 19/14* | (2014.01) |
| *H04N 19/176* | (2014.01) |
| *H04N 19/61* | (2014.01) |
| *H04N 19/132* | (2014.01) |

(52) U.S. Cl.
CPC ............. *H04N 19/18* (2014.11); *H03M 7/42* (2013.01); *H04N 19/117* (2014.11); *H04N 19/126* (2014.11); *H04N 19/132* (2014.11); *H04N 19/14* (2014.11); *H04N 19/176* (2014.11); *H04N 19/61* (2014.11)

(58) Field of Classification Search
CPC .... H04N 19/18; H04N 19/117; H04N 19/132; H04N 19/176; H04N 19/126; H04N 19/14; H04N 19/61; H03M 7/42
See application file for complete search history.

(56) References Cited

U.S. PATENT DOCUMENTS

| | | | | |
|---|---|---|---|---|
| 5,162,908 | A | * | 11/1992 | Kim ................... H04N 19/60 375/240.2 |
| 8,325,808 | B2 | | 12/2012 | Pun et al. |
| 8,422,546 | B2 | | 4/2013 | Lin et al. |
| 2010/0290533 | A1 | * | 11/2010 | Minagawa ............ H03M 7/40 375/240.23 |
| 2011/0211636 | A1 | | 9/2011 | Yamada et al. |

(Continued)

*Primary Examiner* — Tracy Y. Li
(74) *Attorney, Agent, or Firm* — Chip Law Group

(57) ABSTRACT

An embedded codec (EBC) circuitry includes a memory to store a plurality of one dimensional (1D) sub-blocks of quantized-transformed residual levels for a 1D image block and encoder circuitry to allocate a set of signaling bits to each 1D sub-block of the plurality of 1D sub-blocks. The encoder circuitry selects an entropy coding scheme, from a set of entropy coding schemes, for each 1D sub-block of the plurality of 1D sub-blocks, based on the allocated set of signaling bits for each 1D sub-block. The encoder circuitry generates a bit-stream of encoded 1D image block by selective application of the entropy coding scheme on a DC quantized-transformed residual level, a plurality of AC quantized-transformed residual levels, or a combination of the DC quantized-transformed residual level and the plurality of AC quantized-transformed residual levels of each 1D sub-block of the plurality of 1D sub-blocks.

21 Claims, 6 Drawing Sheets

(56) References Cited

U.S. PATENT DOCUMENTS

2014/0307801 A1* 10/2014 Ikai .................. H04N 19/14
                                              375/240.18
2014/0369617 A1  12/2014 Hiwatashi et al.
2016/0261870 A1   9/2016 Tu et al.

* cited by examiner

EMBEDDED CODEC CIRCUITRY FOR SUB-BLOCK BASED ENTROPY CODING OF QUANTIZED-TRANSFORMED RESIDUAL LEVELS

CROSS-REFERENCE TO RELATED APPLICATIONS/INCORPORATION BY REFERENCE

None.

FIELD

Various embodiments of the disclosure relate to image and video compression and decompression technology in embedded codec circuitry. More specifically, various embodiments of the disclosure relate to embedded codec circuitry for sub-block based entropy coding of quantized-transformed residual levels.

BACKGROUND

With recent advancements in imaging technologies for image compression, there is an increasing demand for on-chip codecs in image capturing and display devices to enable storage of high resolution images, for example full high definition (HD), 4K resolution, and 8K resolution, without having a significant degradation in quality and/or an impact on memory usage. In compression, at the entropy coding stage, bit allocation as per a specific bit budget plays a crucial role in achieving a desired compression ratio and to save bits with respect to a set bit budget. Conventionally, at the entropy coding stage, the number of bits used to encode some of the image blocks may include redundant bits, whereas a number of bits used to encode other image blocks may be optimal for such image blocks. The redundancy in the number of bits for entropy coding varies with different image blocks based on a level of complexity or a flatness level indicated by different values in the image blocks and conventionally, the image blocks are entropy coded without removal of redundant bits that leads to inefficiency in compression.

Further limitations and disadvantages of conventional and traditional approaches will become apparent to one skill in the art, through comparison of described systems with some aspects of the present disclosure, as set forth in the remainder of the present application and with reference to the drawings.

SUMMARY

An embedded codec (EBC) circuitry and a method for sub-block based entropy coding of quantized-transformed residual levels are provided, substantially as shown in, and/or described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Various embodiments of the present disclosure may be found in a method and embedded codec (EBC) circuitry for sub-block based entropy coding of quantized-transformed residual levels. The EBC circuitry may include a memory and an encoder circuitry that may handle generation of encoded bit-stream of a 1D image block. The disclosed EBC circuitry classifies different sub-blocks of a 1D image block based on a complexity level and a flatness level of different sub-blocks at the entropy coding stage of encoder circuitry. Specific entropy coding schemes are selected at a sub-block level based on a sub-block category associated with a corresponding 1D sub-block. The differentiation at a sub-block level further renders an opportunity to adaptively reduce an allocation of bits to a sub-block based on a level of complexity represented at the sub-block level. A flat sub-block, i.e. a 1D sub-block that has all the AC coefficients zero may not require level coding, and in such cases, a signaling bit to represent a sub-block category may also represent the AC quantized-transformed residual level of that 1D sub-block. The selective application of selected entropy coding schemes at the sub-block level reduces a number of bits (e.g., bits per pixel value for 1D sub-block) that are conventionally required to encode a 1D image block.

Figure 1:
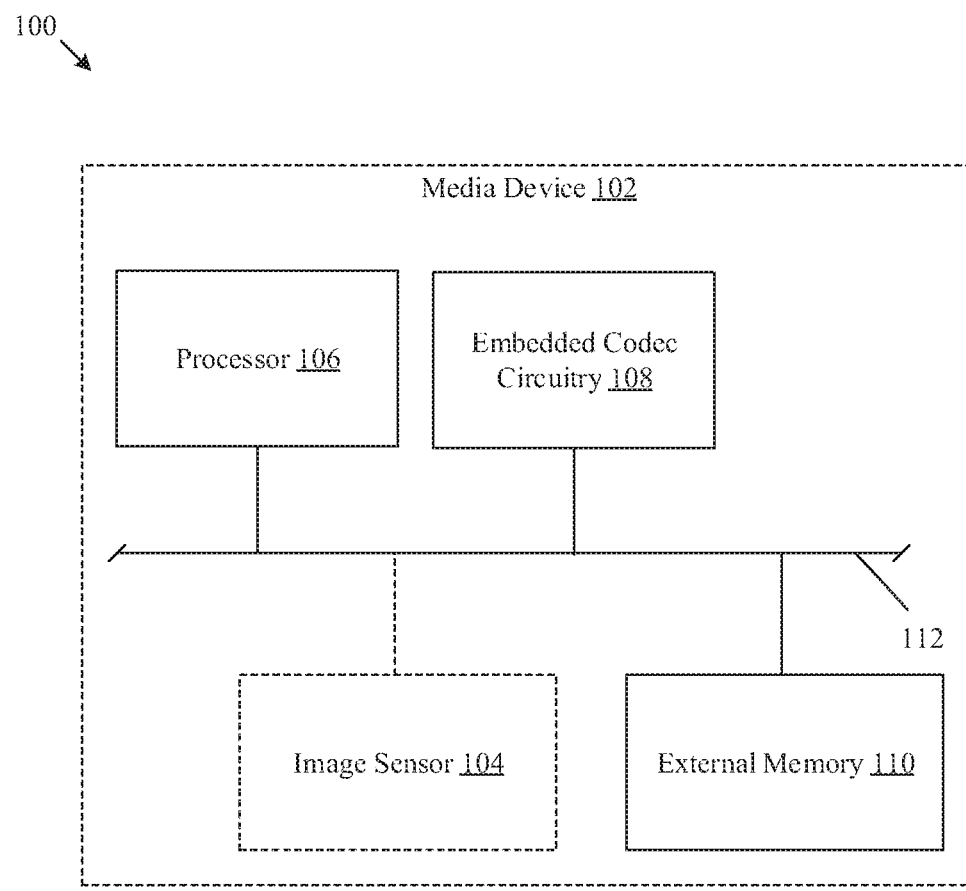
FIG. 1 is a block diagram that illustrates an exemplary media device with an embedded codec (EBC) circuitry and other circuitries for sub-block based entropy coding, in accordance with an embodiment of the disclosure.

FIG. 1 is a block diagram that illustrates an exemplary media device with an embedded codec (EBC) circuitry and other circuitries for sub-block based entropy coding, in accordance with an embodiment of the disclosure. With reference to FIG. 1, there is shown a media device 102 that includes a processor 106, an embedded codec (EBC) circuitry 108, and an external memory 110. In some embodiments, an image sensor 104 may be interfaced with the processor 106, the EBC circuitry 108, and the external memory 110. There is further shown a system bus 112 that interconnects the image sensor 104, the processor 106, the EBC circuitry 108, and the external memory 110.

The media device 102 may comprise suitable logic, circuitry, and interfaces that may be configured to store uncompressed raw images and/or videos as encoded (i.e. compressed) images and/or videos in the external memory 110. The media device 102 may be further configured to manage encoding as well as decoding of media content (for example, encoded images and/or videos) and further playback of the decoded media content at the media device 102. The media device 102 may include a dedicated on-chip codec circuitry (such as the EBC circuitry 108), and the external memory 110 for storage of images (raw uncompressed or encoded), along with other computational circuitries for an offline (without network) encoding of the media content at the media device 102. In some embodiments, the media device 102 may also include one or more image sensors (such as the image sensor 104) to capture images in a raw image file format, which is an uncompressed file format. In such cases, the captured image may be encoded by the EBC circuitry 108 of the media device 102. Examples of the media device 102 may include, but are not limited to, a digital camera, a portable communication device (e.g. laptops, smartphones, tablets, phablets, smart watches, smart glasses, etc.), a media server, a workstation, a desktop computer, and augmented reality/Virtual Reality/Mixed Reality (AR/VR/MR) devices.

Although not shown in FIG. 1, the media device 102 may also include a network interface that may be configured to manage sharing of encoded and/or raw uncompressed images and/or videos with other peripheral or peer-connected devices, through a communication network (also not shown). The detailed description of the network interface and the communication network has been omitted from the present disclosure for the sake of brevity.

The image sensor 104 may comprise suitable logic, circuitry, and interfaces that may be configured to capture a raw uncompressed image or a sequence of raw uncompressed images of a scene in a field-of-view (FOV) of the image sensor. The image sensor 104 may be implemented as an active pixel sensor, such as a complementary-metal-oxide semiconductor (CMOS) sensor. In such implementation, the image sensor 104 may be configured to execute progressive scan (line-by-line) of each row or column of pixels (one dimensional (1D) pixel-array or 1D image block) on a sensor core of the CMOS sensor. The progressive scan may be a vertical scan (column wise) or a horizontal scan (row wise). In some embodiments, instead of an active pixel sensor, the image sensor 104 may be implemented as one of a passive pixel sensor (such as a charged coupled device (CCD) sensor, an oversampled binary image sensor, a planar Fourier capture array (PFCA), a back-illuminated (BSI or BI) sensor, and the like. Although not shown, the image sensor 104 may also include a specialized microprocessor (or a microcontroller) that is configured to operate in accordance with image data from the image sensor 104, a graphic processing unit (GPU) to process images stored in a frame buffer, and/or a memory integrated with the image sensor 104.

The processor 106 may comprise suitable logic, circuitry, and interfaces that may be configured to execute a set of instructions stored in a dedicated memory (e.g., the external memory 110 or an on-chip memory in the EBC circuitry 108). The processor 106 may be implemented based on a number of processor technologies known in the art. Examples of the processor 106 may include, but are not limited to, a Graphical Processing Unit (GPU), a co-processor (such as a specialized image co-processor) for a processor, a specialized digital signal processor, a Central Processing Unit (CPU), an x86-based processor, an x64-based processor, a Reduced Instruction Set Computing (RISC) processor, an Application-Specific Integrated Circuit (ASIC) processor, a Complex Instruction Set Computing (CISC) processor.

The EBC circuitry 108 may comprise suitable logic, circuitry, and interfaces that may be configured to encode a 1D image block (e.g., 16×1 or a 8×1 image block) as per a specific compression factor and further decode the encoded 1D image block, in response to instructions received at the EBC circuitry 108. The 1D image block may be part of an input image (i.e. a raw uncompressed image) or a pixel array (row or column) retrieved directly from a read out register of the image sensor 104, following a row-wise or a column-wise scan by the image sensor 104. The EBC circuitry 108 may further manage storage of a bit-stream of encoded 1D image block in the external memory 110 or may manage transfer of the bit-stream of encoded 1D image to other media devices via dedicated communication networks.

The EBC circuitry 108 may be implemented as a specialized hardware encoder/decoder interfaced with the other computational circuitries of the media device 102. In such implementation, the EBC circuitry 108 may be associated with a specific form factor on a specific computational circuitry. Examples of the specific computational circuitry may include, but are not limited to, a field programmable gate array (FPGA), programmable logic devices (PLDs), an application specific integrated circuit (ASIC), a programmable ASIC (PL-ASIC), application specific integrated parts (ASSPs), and a System-on-Chip (SOC) based on standard microprocessors (MPUs) or digital signal processors (DSPs). In accordance with another embodiment, the EBC circuitry 108 may be also interfaced with a graphical processing unit (GPU) to parallelize operations of the EBC circuitry 108. In accordance with yet another embodiment, the EBC circuitry 108 may be implemented as a combination of programmable instructions stored in a memory and logical units (or programmable logic units) on a hardware circuitry of the media device 102.

The external memory 110 may comprise suitable logic, circuitry, and interfaces that may be configured to store an input image (uncompressed raw or encoded) or a sequence of input images. The external memory 110 may be further configured to act as an image buffer to store raw uncompressed 1D image blocks retrieved directly from the image sensor 104. Additionally, the external memory 110 may store instructions associated with sequential encoding/decoding schemes that may be selectively applied, by the EBC circuitry 108, to generate a bit-stream of encoded 1D image block. In an exemplary embodiment, the external memory 110 may be dynamic random access memory (DRAM) circuits that may be externally interfaced with the EBC circuitry 108. In another exemplary embodiment, the external memory 110 may be static random access memory (SRAM) circuits that may be externally interfaced with the EBC circuitry 108. Further examples of implementation of the external memory 110 may include, but are not limited to, Random Access Memory (RAM), Read Only Memory (ROM), Electrically Erasable Programmable Read-Only Memory (EEPROM), Hard Disk Drive (HDD), a Solid-State Drive (SSD), a CPU cache, or a Secure Digital (SD) card.

Although not shown in FIG. 1, the media device 102 may further include a video codec that may be implemented by known codec standards that may include Advanced Video Codec (AVC)/Media Experts Group (MPEG-4/AVC) or H.264, MPEG-4/HEVC or H.265, and the like. Additionally, the video codec may be supported by other codec libraries that may include FFmpeg, Xvid, DIVx, VP1-9, Windows Media Codec, FFays, and the like.

The system bus 112 may be a hardware bus that may include a set of data channels (or conductive paths) to different components of the media device 102. Alternatively stated, the system bus 112 may interconnect at least data ports, address ports, and control signal ports of different components of the media device 102. For example, the system bus 112 may interconnect the image sensor 104, the processor 106, the EBC circuitry 108, the external memory 110, and other circuitries to each other. The system bus 112 may be configured to facilitate a serial data communication or parallelized data communication between different components on-board the media device 102. Examples of the system bus 112 may include an 8-bit parallel single system bus, a 16-bit parallel single system bus, a 32-bit parallel single system bus, a 64-bit parallel single system bus, a serial data bus, and the like.

In operation, a 1D image block or a sequence of 1D image blocks may be received by the external memory 110 of the media device 102. In some embodiments, the 1D image block or the sequence of 1D image blocks may be retrieved directly from a read-out register of an on-chip image sensor (such as the image sensor 104) or a camera device interfaced with the media device 102. In other embodiments, the 1D image block or the sequence of 1D image blocks may be retrieved from an uncompressed raw input image stored in a persistent storage of the media device 102 or received externally from other media storage devices, such as cameras, data servers, etc.

The EBC circuitry 108 may be configured to receive the 1D image block or the sequence of 1D image blocks from the external memory 110 or directly from the read out register of the image sensor 104. The EBC circuitry 108 may be configured to execute a sequential encoding scheme on the 1D image block to generate a bit-stream of encoded 1D image block. The bit-stream of encoded 1D image block may include header information that may indicate the sequential encoding scheme applied at encoding of the 1D image block, to obtain the bit-stream of encoded 1D image block. The sequential encoding scheme may include a sequential application of a 1D transform, followed by quantization, a residual prediction, and an entropy coding scheme selected for each 1D sub-block of plurality of 1D sub-blocks.

In the sequential encoding scheme, the EBC circuitry 108 may be configured to partition the 1D image block for example, a "16×1" image block, into a plurality of 1D image sub-blocks. The plurality of 1D image sub-blocks may correspond to a logical partition of the 1D image block into regions that have stronger edges. For example, a "16×1" image block may be partitioned into four "4×1" 1D image sub-blocks, where each "4×1" 1D image sub-block may include strong edges, i.e. a larger difference in pixel values at edges of two consecutive "4×1" 1D image sub-blocks.

The EBC circuitry 108 may be further configured to apply a 1D forward transform separately on each 1D image sub-block of the plurality of 1D image sub-blocks, to generate a plurality of 1D transform coefficients. In accordance with an embodiment, the 1D forward transform may be based on a family of sinusoidal unitary transforms (that includes a family of orthonormal bases or eigenvectors). Examples of the 1D forward transform may include, but are not limited to, type I-VIII Discrete Cosine Transform (DCT), type I-VIII Discrete Sine Transform (DST), Discrete Wavelet Transform (DWT), and a Dual-Tree Complex Wavelet Transform (DCWT).

For example, a "4×1" 1D DCT transform may be applied on each "4×1" image sub-block of a "16×1" image block. Similarly, an "8×1" 1D DCT transform may be applied on each "8×1" image sub-block of a "16×1 image block". Thus, as a result, a type of the 1D transform applied on the 1D image block is based on a size of each 1D image sub-block of the 1D image block. The size of each 1D image sub-block of the plurality of 1D image sub-blocks may be specified prior to the encoding of the 1D image block.

The EBC circuitry 108 may be further configured to quantize the plurality of 1D transform coefficients for each 1D image sub-block to generate a plurality of quantized-transformed levels. The plurality of quantized-transformed levels may be separated from each other by a plurality of discretized quantization bins. A step size for the plurality of quantization bins may be further selected adaptively or uniformly to efficiently quantize a 1D sub-block of transform coefficients into a plurality of quantized-transformed levels. Each quantized-transformed level may be a mid-value from an upper bound and a lower bound of a quantization bin, for example, a quantization bin of "(155,175)" may include a quantized-transformed level of "(155+175)/2", i.e. "165". With quantization, the EBC circuitry 108 may remove redundant coefficient information from transform domain data (i.e. the plurality of transform coefficients for each 1D sub-block of a plurality of 1D sub-blocks) without a visually noticeable degradation of quality.

The plurality of quantization bins may be determined based on a quantization parameter (QP), which may vary with a defined rate in accordance with an adaptive quantization scheme to encode or decode the media content. The QP may vary from 0 to a bit depth of a bit-stream of encoded 1D image block. For example, a QP for an 8-bit bit-stream of compressed 1D image block may be selected as "7" for a first 1D sub-block of transform coefficients and "0" for a second block of transform coefficients, which may indicate that the first 1D sub-block of transform coefficients may be quantized with a finer step size as compared to the second block and the second block may not be quantized at all. In certain embodiments, a quantization scheme that is implemented on the plurality of transform coefficients of each 1D sub-block of the plurality of 1D sub-blocks is a bit-plane quantization scheme.

The EBC circuitry 108 may be further configured to apply a residual prediction scheme on a plurality of 1D sub-blocks of quantized-transformed levels, where each 1D sub-block may include a plurality of quantized-transformed levels. After application of the residual prediction scheme, a plurality of 1D sub-blocks of quantized-transformed residual levels may be obtained from a plurality of 1D sub-blocks of quantized-transformed levels. The plurality of 1D sub-blocks of quantized-transformed residual levels for a 1D image block may be stored in a memory, such as the external memory 110 or an on-chip memory (e.g., a dedicated SRAM or an on-chip cache) in the EBC circuitry 108. Examples of the residual prediction scheme may include, but are not limited to, a Pulse Coded Modulation (PCM) scheme, a Differential Pulse Code Modulation (DPCM) scheme, or an Adaptive DPCM (ADPCM) scheme. In DPCM and ADPCM schemes, instead of utilizing each quantized-transformed level, a residue is predicted from reference quantization levels.

Each 1D sub-block, for example, a "4×1" sub-block, may include a plurality of quantized-transformed residual levels, which may be further include into a DC quantized-transformed residual level and a plurality of AC quantized-transformed residual levels. Here, "DC" represents direct current (DC) term which is a first term in an image block or a sub-block, and thus exhibit a zero frequency and remaining elements are known as alternative current (AC) terms (also referred to as AC values or coefficients) that exhibit a non-zero frequency. Thus, AC quantized-transformed residual levels corresponds to quantized-transformed residual levels of AC coefficients (values). In accordance with an embodiment, the EBC circuitry 108 may be configured to apply a PCM scheme on all AC quantized-transformed levels in a 1D sub-block and a DPCM scheme on a DC quantized-transformed level (i.e., quantized-transformed level of the DC coefficients (or value) in the same 1D sub-block.

In order to entropy encode the plurality of 1D sub-blocks of quantized-transformed residual levels, the EBC circuitry 108 may be further configured to estimate a measure of a flatness level or a complexity level of each 1D sub-block. The measure of a flatness level or a complexity level may be defined based on absolute values of AC quantized-transformed residual levels in each 1D sub-block of the plurality of 1D sub-blocks. Thus, the EBC circuitry 108 may be configured to classify each 1D sub-block into a sub-block category of a plurality of sub-block categories. For example, there may be three sub-block categories, i.e., a first sub-block category, a second sub-block category, and a third sub-block category. The first sub-block category may represent a low complexity level of AC quantized-transformed residual levels and a possibility of reduce a number of bits that could be used to represent the AC quantized-transformed residual levels for a 1D sub-block, as compared to conventional entropy coding schemes. The second sub-block category may represent a medium complexity level of AC quantized-transformed residual levels and a possibility to reduce a number of bits (less than that for the first sub-block category) for a 1D sub-block, as compared to conventional entropy coding schemes. The third sub-block category may represent a high complexity level of AC quantized-transformed residual levels. In the third sub-block category, there is no possibility in reduction in allocation of a number of bits to represent a 1D sub-block as compared to conventional entropy coding schemes.

The classification of a 1D sub-block of the plurality of 1D sub-blocks into a sub-block category may be done based on allocation of a set of signaling bits to the 1D sub-block. Thus, the EBC circuitry 108 may be configured to allocate a set of signaling bits to each 1D sub-block of the plurality of 1D sub-blocks, in accordance with a measure of a complexity level or a flatness level of the corresponding 1D sub-block. The EBC circuitry 108 may be configured to select suitable entropy coding schemes for AC and DC quantized-transformed residual levels of different 1D sub-blocks, based on the allocated set of signaling bits to different 1D sub-blocks of quantized-transformed residual levels. For example, a set of signaling bits for a 1D sub-block that is associated with a first sub-block category, may be "0". The EBC circuitry 108 may utilize the allocated set of signaling bits at the encoder stage to select an optimal entropy coding scheme for each 1D sub-block of the plurality of 1D sub-blocks of quantized-transformed residual levels. Similarly, the allocated set of signaling bits may be utilized and at the decoder stage to identify an entropy coding scheme that was used at the encoder stage to entropy code each 1D sub-block of the plurality of 1D sub-blocks of quantized-transformed residual levels.

The EBC circuitry 108 may be further configured to generate a bit-stream of encoded 1D image block by application of the entropy coding scheme selectively on a DC quantized-transformed residual level and a plurality of AC quantized-transformed residual levels of each 1D sub-block of the plurality of 1D sub-blocks. The selective application of the entropy coding scheme may be done in accordance with a sub-block category of a corresponding 1D sub-block and a specified entropy coding for a sub-block category. For example, AC quantized-transformed residual levels that lie under a first sub-block category (i.e., a 1D sub-block that exhibits low complexity level) may not require a level coding, and the allocated set of signaling bits, such as "0", may also represent the AC quantized-transformed residual levels of that 1D sub-block. Thus, for a 4×1 sub-block with three AC quantized-transformed residual levels, a single bit "0" may represent the signaling bit and the three AC quantized-transformed residual levels and thereby, saving at least three bits in the encoding process.

In accordance with another embodiment, an EBC decoder circuitry (not shown in FIG. 1) of the EBC circuitry 108 may be configured to pre-store different coding tables (e.g., custom coding tables for Huffman encoding schemes, Exponential-Golomb encoding schemes, or signaling bit tables) and quantization tables. Therefore, the bit-stream of encoded 1D image block may need not include different coding tables and quantization tables.

In accordance with an embodiment, the EBC circuitry 108 may be configured to generate the bit-stream of encoded 1D image block such that the bit-stream may be decodable by different external decoders that may utilize different decoding schemes to decode the bit-stream of encoded 1D image block. In such a case, the EBC circuitry 108 may be configured to add different coding tables (e.g., custom coding tables for Huffman encoding schemes, Exponential-Golomb encoding schemes, or signaling bit tables) and quantization tables, in header information or a different meta-stream associated with the bit-stream of encoded 1D image block. By addition of such custom tables and quantization tables in the bit-stream, the output of the EBC circuitry 108 may be decodable by other decoder circuitries.

In accordance with an embodiment, the bit-stream of encoded 1D image block may be stored as part of an input image (such as, a 2D image) in the memory, such as the external memory 110 or an on-chip memory in the EBC circuitry 108. The bit-stream of encoded 1D image block may have multiple implementations in different applications. Some of the implementations have been briefly presented herein. In one implementation, the processor 106 may be configured to transfer the bit-stream of encoded 1D image block, via the system bus 112, to a frame buffer (or a frame store) of a display circuitry (e.g., a video card) communicatively interfaced with the system bus 112 of the media device 102. The frame buffer may act as a compressed frame buffer for the display circuitry. The display circuitry (not shown in FIG. 1) may decode and further utilize the bit-stream of encoded bit-stream of 1D image block to display a patch of image onto a display screen of the media device 102. In another implementation, the processor 106 may be configured to transfer the bit-stream of encoded 1D image block, via the system bus 112, to a decoder buffer, such as a decoder picture buffer (DPB) of a video decoder, a buffer memory for an image decoder, or a coded picture buffer (CPB) of a video codec, in the media device 102.

In an exemplary implementation, the media device 102 may be a camera, such as a digital video camera or a digital image camera, and the bit-stream of encoded 1D image block may correspond to a 1D array of pixel values that are directly received from a read-out register of a CMOS sensor in the camera. In a specific scenario, the EBC circuitry 108 may be implemented in the CMOS sensor circuitry. The detailed operation of EBC circuitry 108 has been further described in detail, for example in FIGS. 2, 3, and 4.

Figure 2:
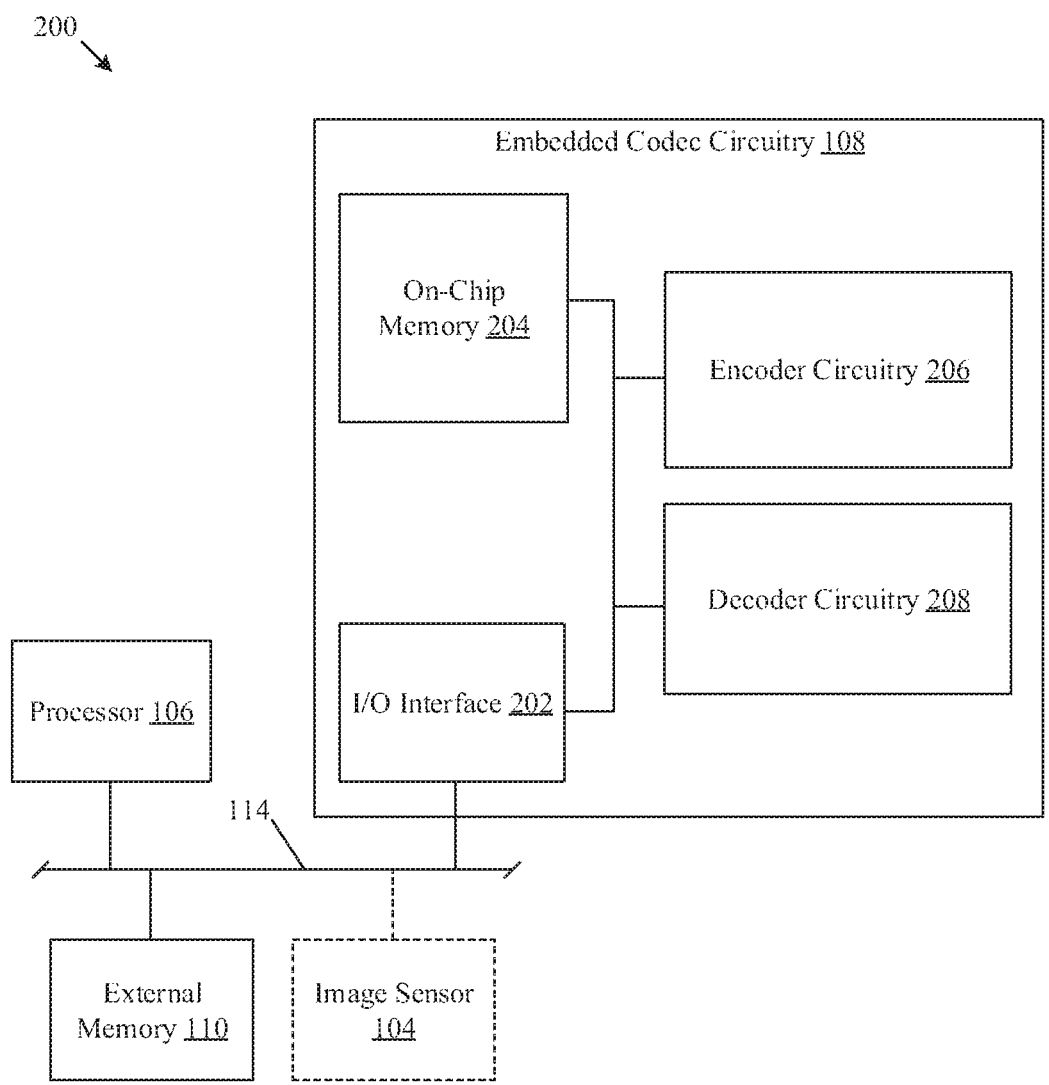
FIG. 2 is a block diagram that illustrates the EBC circuitry of FIG. 1 with various peripheral components for sub-block based entropy coding of quantized-transformed residual levels, in accordance with an embodiment of the disclosure.

FIG. 2 is a block diagram that illustrates an embedded codec (EBC) circuitry with various peripheral components for sub-block based entropy coding of quantized-transformed residual levels, in accordance with an embodiment of the disclosure. FIG. 2 is explained in conjunction with elements from FIG. 1. With reference to FIG. 2, there is shown a block diagram 200 of the EBC circuitry 108. The EBC circuitry 108 may include an Input/output (I/O) interface 202, an on-chip memory 204, an encoder circuitry 206, and a decoder circuitry 208. In the block diagram 200, there is also shown the image sensor 104, the processor 106, and the external memory 110 communicatively coupled to the EBC circuitry 108, via the system bus 112. In some embodiments, the processor 106 and the external memory 110 may be implemented inside the EBC circuitry 108, without a deviation from the scope of the disclosure.

The I/O interface 202 may comprise suitable logic, circuitry, and interfaces that may be configured to manage a plurality of I/O ports to facilitate exchange of communication data from other peripheral circuitries, via the system bus 112, for example, the external memory 110, the processor 106, or the image sensor 104. The communication data may include a bit-stream of the encoded 1D image block, control signals, CPU instructions, and the like. The configuration of the I/O ports may depend on a specification of the EBC circuitry 108, for example, physical I/O pins in an ASIC, FPGA or a SoC chip.

The on-chip memory 204 may comprise suitable logic, circuitry, and interfaces that may be configured to store different operational data (e.g., transform domain data, residual levels, quantization levels, entropy coded bits, etc.) that may be utilized by different components of the EBC circuitry 108 to encode the 1D image block. Examples of the operational data that the on-chip memory 204 may be configured to store may include, but are not limited to, a bit-stream of encoded 1D image block, transform-domain data, quantized-transformed levels, quantized-transformed residual levels, and 1D/2D image blocks. The on-chip memory 204 may be implemented as a specific memory designed with a defined memory specification, such as a read/write speed, a memory size, fabrication factors, and the like. Examples of the on-chip memory 204 may include, but are not limited to, static random access memory (SRAM), dynamic access memory (DRAM), and Static Dynamic RAM (SD-RAM).

The encoder circuitry 206 may comprise suitable logic, circuitry, and interfaces that may be configured to generate a bit-stream of encoded 1D image block by application of a sequential encoding scheme on a 1D image block, stored in a memory, such as the on-chip memory 204 or the external memory 110. The encoder circuitry 206 may also classify different 1D sub-blocks (of quantized-transformed residual levels) into different sub-block categories and selectively apply different entropy coding schemes based on different sub-block categories. The encoder circuitry 206 may be optimized to reduce a number of bits that are used to encode a 1D sub-block of each 1D sub-block of quantized-transformed residual levels to improve a compaction efficiency or a compression factor of the inputted 1D image block. In some embodiments, the encoder circuitry 206 may be a hardware encoder chip that may be implemented based on one of ASIC, programmable logic devices (PLDs), SOC, FPGA, digital signal processors (DSPs) or other specialized circuitries. In other embodiments, the encoder circuitry 206 may be implemented as a combination of hardware and stored set of instructions in the on-chip memory 204 (for example, instructions based on VHDL or HDL logic).

The decoder circuitry 208 may comprise suitable logic, circuitry, and interfaces that may be configured to decode a bit-stream of encoded 1D image block based on header information and a set of signaling bits allocated to each 1D sub-block of the plurality of 1D sub-blocks (associated with an encoded 1D image block). The decoder circuitry 208 may have pre-stored quantization tables and coding tables that may act as a reference for the decoder circuitry 208 to decode the bit-stream of encoded 1D image block. In some embodiments, the decoder circuitry 208 may be a hardware encoder chip that may be implemented based on one of ASIC, programmable logic devices (PLDs), SOC, FPGA, digital signal processors (DSPs) or other specialized circuitries. In other embodiments, the decoder circuitry 208 may be implemented as a combination of hardware and stored set of instructions in the on-chip memory 204 (for example, instructions based on VHDL or HDL logic).

In operation, a plurality of 1D sub-blocks of quantized-transformed residual levels of a 1D image block may be stored in the memory, such as the external memory 110 or the on-chip memory 204. Prior to storage, the plurality of 1D sub-blocks of quantized-transformed residual levels may be generated based on a sequential application of a 1D forward transform, followed by a quantization, and a residual prediction for a plurality of 1D image sub-blocks of the 1D image block. For example, in a "16×1" image block, there may be four "4×1" image sub-blocks. The encoder circuitry 206 may be configured to generate four "4×1" sub-blocks of quantized-transformed residual levels, based on a sequential application of a "4×1" DCT-II transform on each "4×1" sub-block, a bit-plane quantization for a quantization parameter of "7", and a PCM coding for AC quantized-transformed levels and DPCM for DC quantized-transformed levels in each "4×1" sub-block of four "4×1" sub-blocks.

In order to entropy encode the plurality of 1D sub-blocks of quantized-transformed residual levels, the encoder circuitry 206 may be configured to retrieve the stored plurality of 1D sub-blocks of quantized-transformed residual levels from the memory, such as the external memory 110 or the on-chip memory 204. Each 1D sub-block may be a DC quantized-transformed residual level and a plurality of AC quantized-transformed residual levels, for example, a 4×1 sub-block may have one DC quantized-transformed residual level and three AC quantized-transformed residual levels.

The position of the DC and AC quantized-transformed residual levels in each 1D sub-block may be based on a direction (e.g., a left-to-right scan order or a right-to-left scan order for a 1D block or sub-block) selected for application of 1D forward transform. For example, an application of a 1D-row DCT transform may generate a DC transform coefficient at a first position and remaining AC transform coefficients at subsequent positions in a row of a 1D sub-block. Similarly, an application of a 1 D-column DCT transform may generate a DC transform coefficient at a first position and remaining AC transform coefficients at subsequent positions in a column of a 1D sub-block.

Different 1D sub-blocks in the plurality of 1D sub-blocks of quantized-transformed residual levels may exhibit a different level of complexity (or level of flatness). The level of complexity or flatness may correspond to strong edges around different partitions (e.g., around edges of a "4×1" image sub-block of a "16×1" image block) of the 1D image block. As an example, an 12×1 image block may have three 4×1 image sub-blocks, shown by Table 1 as follows:

TABLE 1

12 × 1 Image Block

| $P_n$ | 76 | 76 | 96 | 80 | 76 | 80 | 100 | 188 | 474 | 500 | 120 | 96 |
|---|---|---|---|---|---|---|---|---|---|---|---|---|
| n | 0 | 1 | 2 | 3 | 4 | 5 | 6 | 7 | 8 | 9 | 10 | 11 |

Where "$P_n$" represents a value of transform coefficient at a position "n" in the "12×1" image block.

In Table 1, as shown, in first sub-block, pixel values, i.e. $P_0$, $P_1$, $P_2$, and $P_3$, have a mean of "82" and a standard deviation (i.e. a spread of pixel values around a mean value) of "9.512". In second sub-block, pixel values, P4, P5, P6, and P7, have a mean of "111" and a standard deviation of "52.39593". Similarly, in the third sub-block, pixels values, i.e. P8, P9, P10, and P11, have a mean of "297.5" and a standard deviation of "219.29204". Based on above estimations, the standard deviation of pixel values in first block is low as compared to that of a second sub-block and the third sub-block. Moreover, the pair of pixel values P7 and P8, and another pair of pixel value P9 and P10 show strong edges, i.e., a significant difference in pixel values at consecutive positions in the 12×1 image block. Thus, such variations in individual sub-blocks may be utilized to ascertain that the first block may be a block of low complexity level (where values are very similar or too flat), the second sub-block may be a block of medium complexity level, and the third sub-block may be a block of high complexity level (diversely spread values).

The encoder circuitry 206 may be configured to classify the plurality of 1D sub-blocks of quantized-transformed residual levels of a 1D image block, in accordance with a sub-block category of a plurality of sub-block categories. The set of sub-block categories may include a first sub-block category, a second sub-block category, and a third sub-block category. Each sub-block category of the set of sub-block categories may indicate a different flatness level and a complexity level for a corresponding 1D sub-block of the plurality of 1D sub-blocks. More specifically, the first sub-block category, the second sub-block category, and the third sub-block category may indicate a specific variation (such as a range of values) of AC quantized-transformed residual levels in each 1D sub-block of the plurality of 1D sub-blocks.

In order to identify a sub-block category of a corresponding 1D sub-block at a time of encoding or decoding a 1D sub-block, the encoder circuitry 206 may be configured to allocate a set of signaling bits to each 1D sub-block of the plurality of 1D sub-blocks. The set of signaling bits may be allocated, based on a maximum value of an AC quantized-transformed residual level from a plurality of AC quantized-transformed residual levels in each 1D sub-block of the plurality of 1D sub-blocks. The allocated set of signaling bits may represent a sub-block category for each 1D sub-block of the plurality of 1D sub-blocks, from a set of sub-block categories. The set of signaling bits are allocated to each 1D sub-block of the plurality of 1D sub-blocks such that a number of bits in a bit-stream of the encoded 1D image block may remain less than a bit budget specified for a specific compression ratio for the 1D image block.

In accordance with an embodiment, the encoder circuitry 206 may be configured to compare the maximum value of an AC quantized-transformed residual level from a plurality of AC quantized-transformed residual levels for each 1D sub-block of the plurality of 1D sub-blocks to a first reference value and a second reference value. The maximum value may be an absolute maximum value that is greater than or equal to 0 and the comparison may determine whether the maximum value for each 1D sub-block of the plurality of 1D sub-blocks is equal to the first reference value, the second reference value, or greater than the second reference value.

In accordance with an embodiment, the allocated set of signaling bits may represent the first sub-block category, for a 1D sub-block of the plurality of 1D sub-blocks, when the maximum value of the plurality of AC quantized-transformed residual levels in the 1D sub-block is equal to the first reference value, such as "0". A number of signaling bits in the allocated set of signaling bits to represent the first sub-block category may be "1" bit. The allocated set of signaling bits may similarly represent the second sub-block category, for a 1D sub-block of the plurality of 1D sub-blocks, when the maximum value of the plurality of AC quantized-transformed residual levels in the 1D sub-block is equal to the second reference value, such as "1". The allocated set of signaling bits may represent the third sub-block category, for a 1D sub-block of the plurality of 1D sub-blocks, when the maximum value of the plurality of AC quantized-transformed residual levels in the 1D sub-block is greater than the second reference value, such as "1". A number of signaling bits in the set of signaling bits to represent the second sub-block category and the third sub-block category may be "2" bits.

In certain embodiments, the first reference value is "0" and the second reference value is "1". Thus, the encoder circuitry 206 may be configured to check whether an AC quantized-transformed residual level in each 1D sub-block is equal to "0", "1", or greater than "1". In an example, a first "4×1" sub-block ($SB_1$), a second a third "4×1" sub-block ($SB_3$), and a third "4×1" sub-block ($SB_3$) of quantized-transformed residual levels may be given as follows:

$SB_1$=[−13 0 0 0]
$SB_2$=[−13 1 1 0]
$SB_3$=[−7 6 0 −2]

Here, $SB_1$ has all the AC quantized-transformed residual levels as "0", and therefore, the absolute maximum value of AC quantized-transformed residual levels in $SB_1$ is "0". $SB_2$ may have two of the AC quantized-transformed residual levels as "1" and one of the AC quantized-transformed residual level as "0". Thus, the absolute maximum value of AC quantized-transformed residual levels in $SB_2$ is "1". In $SB_3$, the AC quantized-transformed residual levels are "6", "0", and "−2". The absolute maximum value of AC quantized-transformed residual levels is "6" in $SB_3$. In this example, the absolute maximum value of AC quantized-transformed residual levels in $SB_1$ is equal to "0", which is equal to the first reference value of "0". Thus, $SB_1$ may be allocated one signaling bit, such as "0", as part of an allocation of a set of signaling bits, which may indicate that $SB_1$ is identified by a first sub-block category (that represents substantial flatness level). The absolute maximum value of AC quantized-transformed residual levels in $SB_2$ is equal to "1", which is equal to the second reference value of "1". Thus, $SB_2$ may be allocated two signaling bits, such as "10", as part of an allocation of a set of signaling bits, which may indicate that $SB_2$ is identified by a second sub-block category (that represents moderate flatness level). The absolute maximum value of AC quantized-transformed residual levels in $SB_3$ is equal to "6", which is greater than the first reference value of "0" and the second reference value of "1". Thus, $SB_3$ may be allocated two signaling bits, such as "11", as part of an allocation of a set of signaling bits, which may indicate that $SB_3$ is identified by a third sub-block category (that represents low flatness level or a high complexity level).

The encoder circuitry 206 may be configured to select an entropy coding scheme, from a set of entropy coding schemes, for each 1D sub-block of the plurality of 1D sub-blocks. The set of entropy coding schemes may include, but are not limited to, a Huffman coding scheme, an exponential Golomb coding scheme, a progressive Golomb coding scheme, a Golomb-Rice coding scheme, and a combination of the Huffman coding scheme and the exponential Golomb coding scheme.

The selection of the entropy coding scheme from the set of entropy coding schemes may be done based on the allocated set of signaling bits for each 1D sub-block. The allocated set of signaling bits may be used as a decision factor to select a suitable entropy coding scheme that may reduce a number of bits required to encode a corresponding 1D sub-block. More specifically, the allocation set of signaling bits would signal the encoder circuitry 206 about a level of complexity or flatness of a 1D sub-block and the encoder circuitry 206 may store decision tables or instructions that may specify a selection of a suitable entropy coding scheme for a corresponding 1D sub-block. Also, the selected entropy coding schemes may be selectively applied on a DC quantized-transformed residual level, the plurality of AC quantized-transformed residual levels, or a combination of the DC quantized-transformed residual level and the plurality of AC quantized-transformed residual levels of each 1D sub-block of the plurality of 1D sub-blocks. The selective application of the selected encoding scheme may be done based on a sub-block category of each 1D sub-block of a plurality of 1D sub-blocks of quantized-transformed residual levels.

In accordance with an embodiment, the DC quantized-transformed residual level of a 1D sub-block of the plurality of 1D sub-blocks, may be entropy coded by an entropy coding scheme selected from the set of entropy coding schemes. In such implementations, the encoder circuitry 206 may be further configured to encode the DC quantized-transformed residual level of each 1D sub-block of the plurality of 1D sub-blocks, in accordance with the selected entropy coding scheme. Alternatively stated, the DC quantized-transformed residual level of each 1D sub-block of the plurality of 1D sub-blocks may be encoded by application of a selected entropy coding scheme, irrespective of an association of the corresponding 1D sub-block with the first sub-block category, the second sub-block category, or the third sub-block category.

In accordance with an embodiment, a 1D sub-block associated with the first sub-block category may have no level coding of AC quantized-transformed residual levels. As all the AC quantized-transformed residual levels of a 1D sub-block associated with the first sub-block category may be equal to the first reference value, such as "0", the plurality of AC quantized-transformed residual levels of the 1D sub-block associated with the first sub-block category may be directly represented by the allocated set of signaling bits, such as "0". The direct representation of such AC quantized-transformed residual levels by the allocated set of signaling bits may reduce a requirement to additionally add multiple bits (for example, zeroes) for such AC quantized-transformed residual levels of the 1D sub-block. Also, a set of bits for the plurality of AC quantized-transformed residual levels may be directly decodable using the allocated set of signaling bits.

For example, for a "4×1" sub-block (B), given by $B_1$=[-13 0 0 0], the DC quantized-transformed residual level, i.e. "-13", may be entropy coded to "5 bits", by application of a Huffman entropy coding scheme, which may be the selected entropy coding scheme. As all the AC quantized-transformed residual levels are "0", the "4×1" sub-block may be associated with the first sub-block category and allocated with "0" as a signaling bit. Thus, for such "4×1" sub-block, all the AC quantized-transformed residual levels are same as the allocated signaling bit and thus, the encoder circuitry 206 may be configured to directly represent all the AC quantized-transformed residual levels by the allocated signaling bit. In this case, a total number of bits ($N_B$) to entropy code the "4×1" sub-block ($B_1$) may be computed by equation (1) as follows:

$$N_B = S_B + B_{DC} + B_{AC} \quad (1)$$

Where $S_B$ represents the number of signaling bits, $B_{DC}$ represents a number of bits used to entropy code the DC quantized-transformed residual level, and $B_{AC}$ represents a number of bits used to entropy code the AC quantized-transformed residual levels. For a "4×1" sub-block ($B_1$), $S_B$ may be "1", $B_{DC}$ may be "5", and $B_{AC}$ may be "0" as the signaling bit is also covering bit representation for AC quantized-transformed residual levels. Thus, the total number of bits ($N_B$) may be "6", i.e. a sum of $S_B$ and $B_{DC}$, with a zero contribution of $B_{AC}$.

In accordance with an embodiment, the encoder circuitry 206 may be configured to apply a selected entropy coding scheme (as part of the set of entropy coding schemes) on a 1D sub-block that is associated with the second sub-block category. In the selected entropy coding scheme, an AC quantized-transformed residual level of the plurality of AC quantized-transformed residual levels of the 1D sub-block may be encoded using only a single bit, when the AC quantized-transformed residual level is "0". Otherwise, the encoder circuitry 206 may be configured to encode an AC quantized-transformed residual level of the plurality of AC quantized-transformed residual levels using only a pair of bits, when the AC quantized-transformed residual level is either unsigned "1" or signed "1".

For example, for a "4×1" sub-block ($B_2$), given by $B_2$=[-13 1 1 0], the DC quantized-transformed residual level, i.e. "-13", may be entropy coded to "5 bits", by application of a Huffman entropy coding scheme, which may be the selected entropy coding scheme. As the absolute maximum value from all of the AC quantized-transformed residual levels is "1", $B_2$ may be associated with the second sub-block category and allocated with "10" as a signaling bit. Thus, for $B_2$, first two AC quantized-transformed residual levels are "1" and the third AC quantized-transformed residual level is "0". Thus, the encoder circuitry 206 may be configured to encode the first two AC quantized-transformed residual levels and the third AC quantized-transformed residual level by a level coding scheme. In the level coding scheme, the first two AC quantized-transformed residual levels may be represented by a pair of bits, such as "01" and the third AC quantized-transformed residual level may be represented by one bit, such as "0". In this case, the total number of bits ($N_B$) to entropy code $B_2$ may be computed by the equation (1). For $B_2$, $S_B$ may be "2", $B_{DC}$ may be "5", and $B_{AC}$ may be "2+2+1, i.e. 5". Thus, the total number of bits ($N_B$) may be "12", i.e. a sum of $S_B$ and $B_{DC}$, and a contribution of $B_{AC}$.

In accordance with an embodiment, the encoder circuitry 206 may be configured to apply a selected entropy coding scheme (as part of the set of entropy coding schemes) on a 1D sub-block that is associated with the third sub-block category. The plurality of AC quantized-transformed residual levels of the 1D sub-block, associated with the third sub-block category, may be encoded by the encoder circuitry 206 in accordance with the selected entropy coding scheme.

For example, for a "4×1" sub-block ($B_3$), given by $B_3$=[-7 6 0 -2], the DC quantized-transformed residual level, i.e. "-7", may be entropy coded to "5 bits", by application of a Huffman entropy coding scheme, which may be the selected entropy coding scheme. As the absolute maximum value from all of the AC quantized-transformed residual levels is "6", $B_3$ may be associated with the third sub-block category and allocated with "11" as a signaling bit. Thus, the encoder circuitry 206 may be configured to encode all the AC quantized-transformed residual levels using a selected entropy coding scheme, such as a Huffman entropy coding scheme or an exponential Golomb entropy coding scheme. In this case, the total number of bits ($N_B$) to entropy code $B_3$ may be computed by the equation (1). For $B_3$, $S_B$ may be "2", $B_{DC}$ may be "5", and $B_{AC}$ may be "6+2+5, i.e. 13". The total number of bits ($N_B$) may be "20", i.e. a sum of $S_B$ and $B_{DC}$, and a contribution of $B_{AC}$.

The encoder circuitry 206 may be further configured to generate a bit-stream of the encoded 1D image block by application of the entropy coding scheme selectively on a DC quantized-transformed residual level, the plurality of AC quantized-transformed residual levels, or a combination of the DC quantized-transformed residual level and the plurality of AC quantized-transformed residual levels of each 1D sub-block of the plurality of 1D sub-blocks. More specifically, in a specific scan order, the selection of an entropy coding scheme (from a set of entropy coding schemes) and application of the selected entropy coding scheme for each 1D sub-block may be done selectively for one of a DC, AC, or a combination of DC and AC quantized-transformed residual levels. Such selectivity may ensure that an optimal number of bits can be saved (i.e. a reduction in bits per pixel (bpp) for encoded sub-block) on a sub-block level, where a complexity and flatness level is considered at the time of encoding of each 1D sub-block. A number of bits in the bit-stream of encoded 1D image block may also include a number of the allocated set of signaling bits for each 1D sub-block of the plurality of 1D sub-blocks, in addition to the encoded bits for either of the AC or DC quantized-transformed residual levels.

In conventional entropy coding techniques, the AC quantized-transformed residual levels are encoded using one or more bits for each AC quantized-transformed residual level, without an allocation of a set of signaling bits to indicate a sub-block category. In such scenarios, the 1D image block is not partitioned into image sub-blocks and further categorized based on flatness levels or complexity levels in the 1D image block. For example, "10 bits" for a first "4×1" sub-block, "12 bits" for a second "4×1" sub-block, "18 bits" for a third "4×1" sub-block. Therefore, the total number of bits ($N_B$) would have been "40 bits" in case signaling bit and sub-block level coding is not employed. Thus, on comparison of $N_B$ for $B_1$, $B_2$, and $B_3$ (from previous examples), based on a sub-block level application of entropy coding schemes with conventional application of entropy coding scheme, "10-6, i.e. 4 bits" are saved on first "4×1" sub-block, "12-12, i.e., 0 bits" are saved on second "4×1" sub-block, and "18-20, i.e. 2 bits" are additionally used to encode the third "4×1" sub-block. For the entire "12×1" image block, a total number of bits may be "40" for conventional application of entropy coding schemes, whereas the total number of bits may be "38 bits" based on the disclosed method of application of entropy coding of the 1D image block.

The total number of bits required to encode a 1D image block may reduce over time based on a number of 1D sub-blocks that may lie under the first sub-block category, for example, 1D sub-blocks that have AC quantized-transformed residual levels have an absolute maximum value of "0". As a conclusion, a 1D image block that has more number of sub-blocks lying in the first sub-block category can be encoded as per an increased compression ratio, a reduced bits per pixel (bpp) value associated with substantial bit savings, with respect to conventional techniques. The reduction in number of bits at sub-block level may be a substantial reduction for an input image that is higher definition (HD). For example, if an allocation pattern of signaling bits in each 1D image block is considered uniform, a reduction of "4 bits per 16 pixels" or 0.25 bits per pixel for an input image that has a resolution of 1920×1080, i.e. 2073600 pixels, which may lead to a reduction of 0.25 bits per pixel times 2073600 pixels, i.e. 518400 bits (or "63.28 kilobytes". The operation of the encoder circuitry 206 has been further described in detail, for example, in FIG. 3 and FIG. 4.

Figure 3:
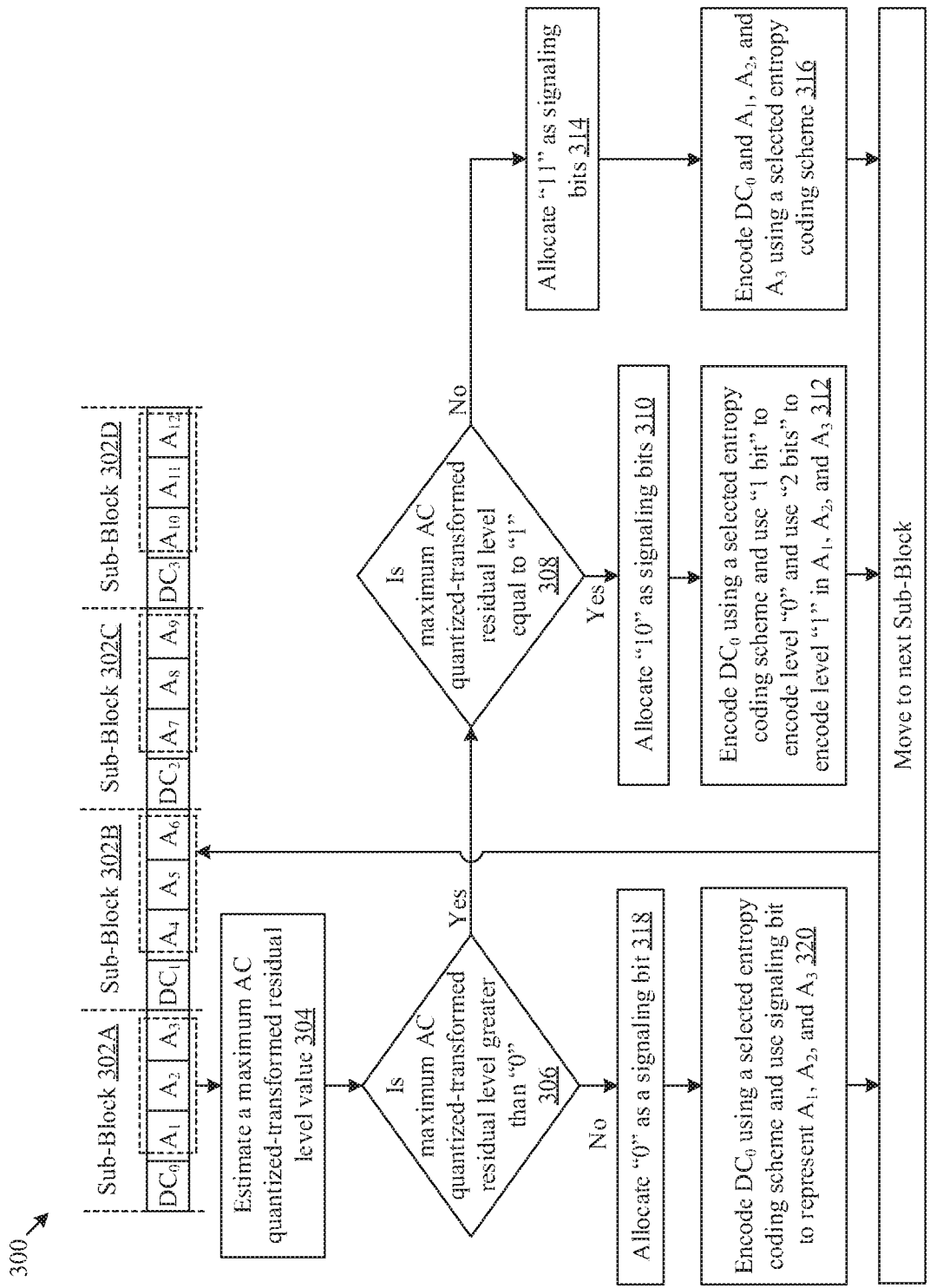
FIG. 3 is a flow diagram that illustrates a method for sub-block based entropy coding of quantized-transformed residual levels by the EBC circuitry of FIG. 2, in accordance with an embodiment of the disclosure.

FIG. 3 is a flow diagram that illustrates a method for sub-block based entropy coding of quantized-transformed residual levels by the EBC circuitry of FIG. 2, in accordance with an embodiment of the disclosure. FIG. 3 is explained in conjunction with elements from FIG. 1 and FIG. 2. With reference to FIG. 3, there is shown a flow diagram 300. The flow diagram 300 may describe a set of operations executed by the encoder circuitry 206 while encoding a plurality of 1D sub-blocks of quantized-transformed residual levels obtained after a sequential application of 1D forward transform, 1D quantization, and a residual prediction on a 1D image block (portioned into a plurality of 1D image sub-blocks. The forward transform may be a "4×1" transform that may be used to generate the transform coefficients. As shown, there are a set of 1D sub-blocks, such as a sub-block 302A, a sub-block 302B, a sub-block 302C, and a sub-block 302D. The encoder circuitry 206 may be configured to sequentially (or in parallel, in some cases) select a sub-block, such as the sub-block 302A, to encode into a bit-stream of encoded 1D sub-block.

At 304, a maximum AC quantized-transformed residual level value is estimated for the sub-block 302A. The encoder circuitry 206 may be configured to estimate a maximum AC quantized-transformed residual level value for the sub-block 302A. In the sub-block 302A, the AC quantized-transformed residual levels are A1, A2, and A3. The encoder circuitry 206 may be configured to estimate a maximum value from $A_1$, $A_2$, and $A_3$, which may be $A_1$, for example.

At 306, it may be determined whether the maximum AC quantized-transformed residual level is greater than "0". The encoder circuitry 206 may be configured to determine whether the maximum AC quantized-transformed residual level is greater than "0". If, the maximum AC quantized-transformed residual levels in the sub-block 302A are greater than "0", the sub-block 302A may be either classified into a first sub-block category or a second sub-block category based on whether the maximum AC quantized-transformed residual level is equal to "1" or more than "1". In a case where the maximum AC quantized-transformed residual level is greater than "0", control passes to 308. Otherwise, control passes to 318.

At 308, it may be further determined whether the maximum AC quantized-transformed residual level is equal to "1". The encoder circuitry 206 may be configured to determine whether the maximum AC quantized-transformed residual level is greater than "0". At this stage, the encoder circuitry 206 may be configured to classify the sub-block 302A into either the first sub-block category or the second sub-block category. In a case where the maximum AC quantized-transformed residual level is equal to "1", control passes to 310. Otherwise, control passes to 314.

At 310, "10" as signaling bits may be allocated to the sub-block 302A. The encoder circuitry 206 may be configured to allocate "10" as signaling bits to the sub-block 302A. The allocation of the signaling bits "10" to the sub-block 302A may indicate that the sub-block 302A is associated with the second sub-block category, which may show moderate flatness level (or moderate complexity level) in terms of individual values of AC quantized-transformed residual levels.

At 312, "$DC_0$" may be encoded using a selected entropy coding scheme (such as Huffman entropy coding scheme), "1 bit" may be used to encode level "0" and "2 bits" may be used to encode level "1" in $A_1$, $A_2$, and $A_3$. Within these 2 bits, the first bit may represent that the absolute value of the level is "1" and the second bit may represent the sign of the level. The encoder circuitry 206 may be configured to encode "$DC_0$" using a selected entropy coding scheme (such as Huffman entropy coding scheme), a level "0" by "1 bit", and a level "1" by "2 bits" in $A_1$, $A_2$, and $A_3$. Thus, the DC quantized-transformed residual level in the sub-block 302A may be coded by application of conventional entropy coding schemes, such as Huffman coding or Exp-Golomb coding and the AC quantized-transformed residual levels may be coded based on a level coding scheme. After the sub-block 302A has been coded, the control may move to the next sub-block, such as the sub-block 302B.

At 314, "11" as signaling bits may be allocated to the sub-block 302A. The encoder circuitry 206 may be configured to allocate "11" (binary system) as signaling bits to the sub-block 302A. The allocation of the signaling bits "11" to the sub-block 302A may indicate that the sub-block 302A is associated with the third sub-block category, which may show low flatness level (or high complexity level) in terms of individual values of AC quantized-transformed residual levels.

At 316, $DC_0$, $A_1$, $A_2$, and $A_3$ may be encoded using a selected entropy coding scheme. The encoder circuitry 206 may be configured to encode $DC_0$, $A_1$, $A_2$, and $A_3$ using a selected entropy coding scheme (such as Huffman entropy coding scheme). Thus, the DC and AC quantized-transformed residual levels in the sub-block 302A may be coded by application of conventional entropy coding schemes, such as Huffman coding or Exp-Golomb coding. After the sub-block 302A has been coded, the control may move to the next sub-block, such as the sub-block 302B.

At 318, "0" as a signaling bit may be allocated to the sub-block 302A. The encoder circuitry 206 may be configured to allocate "0" as a signaling bit to the sub-block 302A. The allocation of the signaling bits "0" to the sub-block 302A may indicate that the sub-block 302A is associated with the first sub-block category, which may show high flatness level (or low complexity level) in terms of individual values of AC quantized-transformed residual levels.

At 320, "$DC_0$" may be encoded using a selected entropy coding scheme (such as Huffman entropy coding scheme or Exp-Golomb coding), and $A_1$, $A_2$, $A_3$ may be directly represented by the allocated signaling bit "0". The encoder circuitry 206 may be configured to encode "$DC_0$" using a selected entropy coding scheme (such as Huffman entropy coding scheme) and directly represent $A_1$, $A_2$, $A_3$ by the allocated signaling bit "0". Thus, the DC quantized-transformed residual level in the sub-block 302A may be coded by application of conventional entropy coding schemes, such as Huffman coding or Exp-Golomb coding and the AC quantized-transformed residual levels may be represented by the allocated signaling bit. After the sub-block 302A is coded, the control may move to the next sub-block, such as the sub-block 302B.

Figure 4:
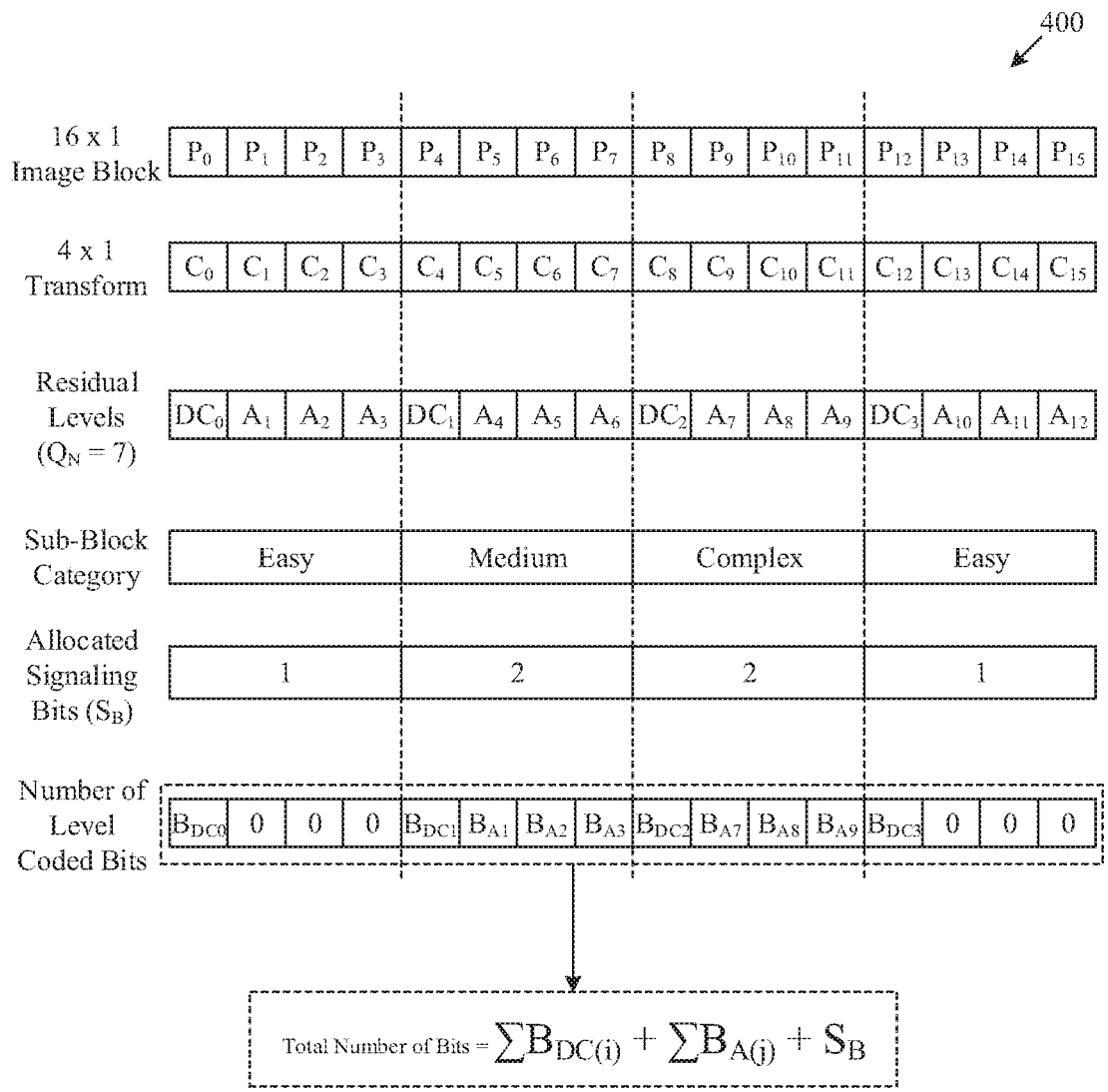
FIG. 4 is a diagram that illustrates different output by application of a schematic encoding scheme on a one dimensional (1D) image block by the EBC circuitry of FIG. 2, in accordance with an embodiment of the disclosure.

FIG. 4 is a diagram that illustrates different output by application of a schematic encoding scheme on a 1D image block by the EBC circuitry of FIG. 2, in accordance with an embodiment of the disclosure. FIG. 4 is explained in conjunction with elements from FIGS. 1, 2, and 3. With reference to FIG. 4, there is shown a diagram 400 that shows outputs of different stages of the encoder circuitry 206 while applying a sequential entropy coding scheme on a 16×1 image block, as shown.

Initially, the encoder circuitry 206 may be configured to retrieve a 16×1 image block, that is partitioned into four image sub-blocks, i.e. $IB_1=[P_0, P_1, P_2, P_3]$, $IB_2=[P_4, P_5, P_6, P_7]$, $IB_3=[P_8, P_9, P_{10}, P_{11}]$, and $IB_4=.[P_{12}, P_{13}, P_{14}, P_{15}]$. The encoder circuitry 206 may be configured to apply a 1D forward transform, such as 4×1 DCT-II integer transform or Hadamard transform, on each of $IB_1$, $IB_2$, $IB_3$, and $IB_4$ to obtain "4" transformed sub-blocks of transform coefficients, i.e. $TB_1=[C_0, C_1, C_2, C_3]$, $TB_2=[C_4, C_5, C_6, C_7]$, $TB_3=[C_8, C_9, C_{10}, C_{11}]$, and $TB_4=.[C_{12}, C_{13}, C_{14}, C_{15}]$. Thereafter, the encoder circuitry 206 may be configured to apply a quantization scheme, such as a bit-plane quantization scheme with a quantization parameter ($Q_N$) of "7", on $TB_1$, $TB_2$, $TB_3$, and $TB_4$, to obtain 4 quantized-transformed sub-blocks, i.e. $QTB_1$, $QTB_2$. $QTB_3$, and $QTB_4$.

The encoder circuitry 206 may be configured to apply a residual prediction scheme, such as DPCM of DC quantized-transformed levels and PCM on AC quantized-transformed residual levels, on each of $QTB_1$, $QTB_2$. $QTB_3$, and $QTB_4$, to obtain four sub-blocks of quantized-transformed residual levels, i.e. $RB_1=[DC_0, A_1, A_2, A_3]$, $RB_2=[DC_4, A_5, A_6, A_7]$, $RB_3=[DC_8, A_9, A_{10}, A_{11}]$, and $RB_4=[DC_{12}, A_{13}, A_{14}, A_{15}]$. Thereafter, the encoder circuitry 206 may be configured to classify each of $RB_1$, $RB_2$, $RB_3$, and $RB_4$ into a sub-block category of a plurality of sub-block categories, which may be indicated as "Easy", "Medium", "Complex", and "Easy" for $RB_1$, $RB_2$, $RB_3$, and $RB_4$, respectively. $RB_1$ and $RB_4$ may have "0" as the maximum quantized-transformed residual level value and therefore, a signaling bit of "0" (a number of signaling bits ($S_B$) of "1") may be used to directly represent all the AC quantized-transformed residual levels of $RB_1$ and $RB_4$. $RB_2$ may have "1" as the maximum quantized-transformed residual level value and therefore, a signaling bit of "10" (a number of signaling bits ($S_B$) of "2") may be used to represent the "medium" sub-block category of $RB_2$, which may be coded by a level coding scheme. $DC_0$, $DC_1$, $DC_2$, and $DC_3$ may be encoded by a selected entropy coding scheme, such as a Huffman entropy coding scheme. $RB_3$ may have the maximum quantized-transformed residual level value greater than "1" and therefore, a signaling bit of "11" (a number of signaling bits ($S_B$) of "2") may be used to represent a "Complex" sub-block category of $RB_3$, which may be coded by a selected entropy coding scheme, such as Huffman coding scheme.

The number of level coded bits may include $B_{DC0}$ for $DC_0$, $B_{DC1}$ for $DC_1$, $B_{DC2}$ for $DC_2$, and $B_{DC3}$ for $DC_3$. Similarly, the number of level coded bits may further include "0" for $A_1$, "0" for $A_2$, "0" for $A_3$, "0" for $A_4$, $BA_5$ for $A_5$, $BA_6$ for $A_6$, $BA_7$ for $A_7$, $BA_8$ for $A_8$, $B_{A9}$ for $A_9$, $BA_{10}$ for $A_{10}$, $BA_{11}$ for $A_{11}$, and "0" for $A_{12}$. The total number of bits ($N_B$) may be given by equation (2), as follows:

$$N_B = \sum_{i=0}^{3} B_{DC(i)} + \sum_{j=1}^{12} A_j + S_B \qquad (2)$$

Figure 5A:
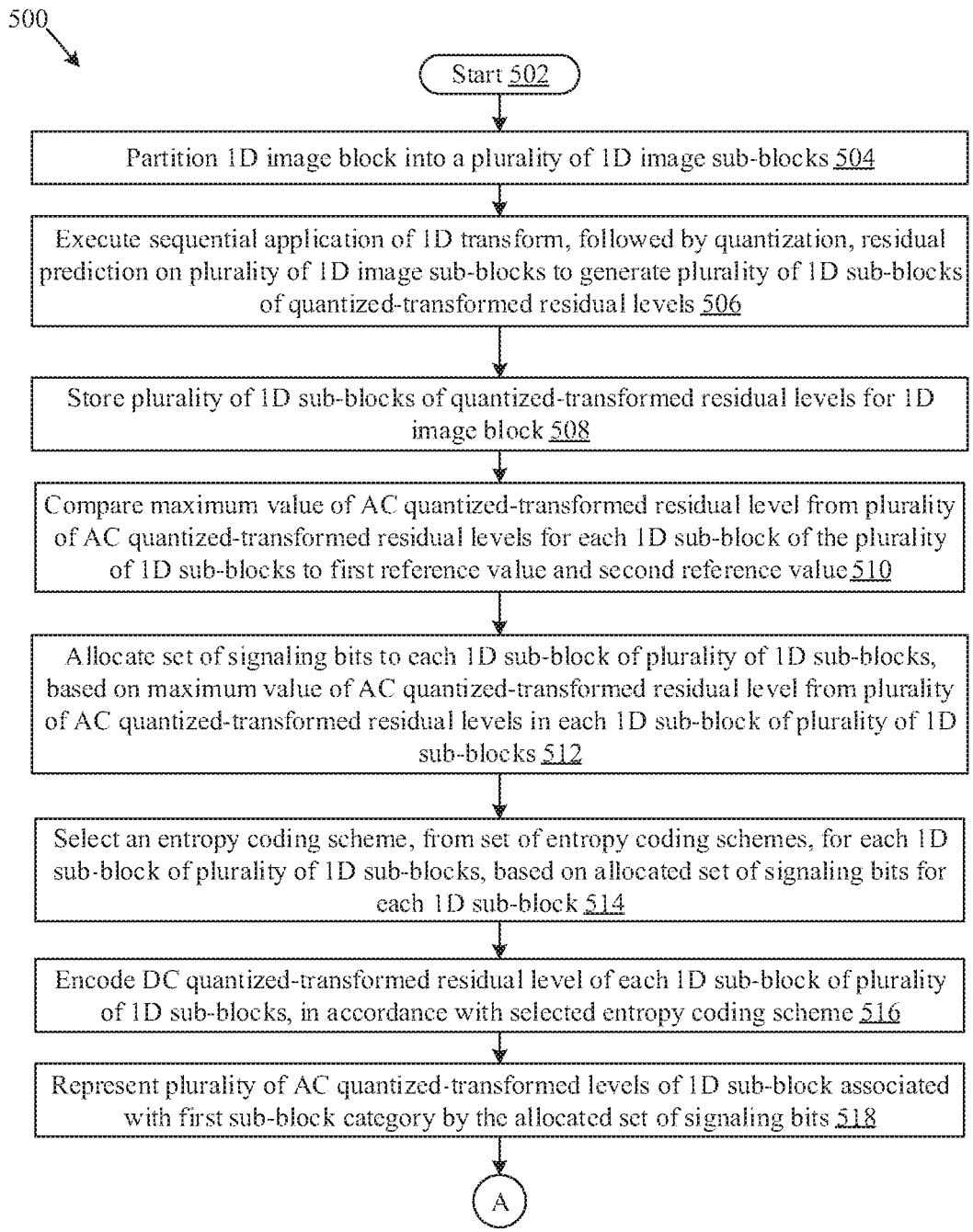
FIGS. 5A and 5B, collectively, depicts a flow chart that illustrates an exemplary method for sub-block based entropy coding of quantized-transformed residual levels, in accordance with an embodiment of the disclosure.
Figure 5B:
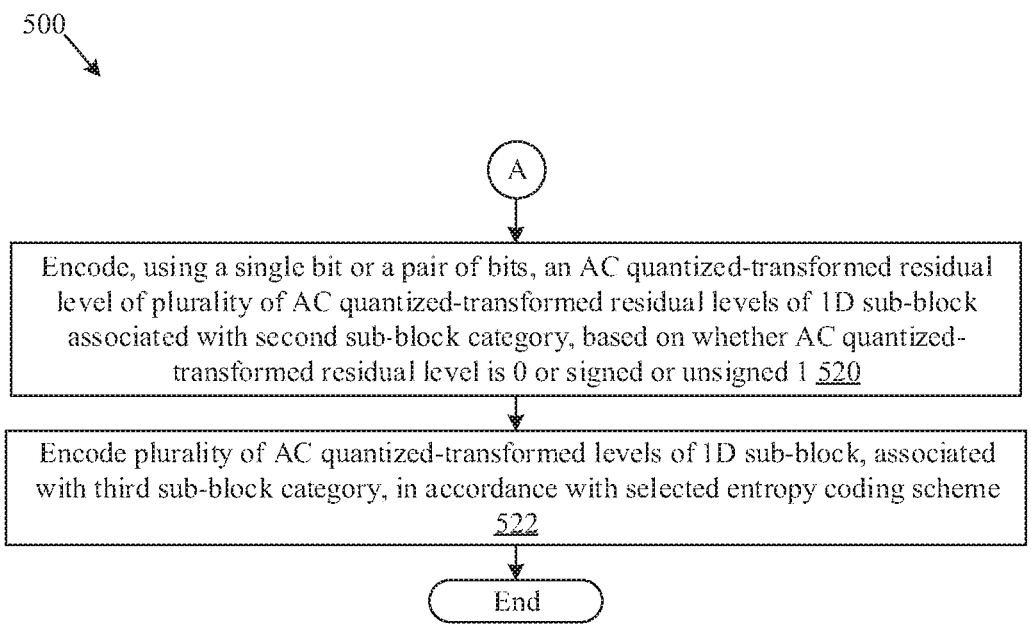

FIGS. 5A and 5B, collectively, depicts a flow chart that illustrates an exemplary method for sub-block based entropy coding of quantized-transformed residual levels, in accordance with an embodiment of the disclosure. FIGS. 5A and 5B are explained in conjunction with elements from FIGS. 1, 2, 3, and 4. With reference to FIGS. 5A and 5B, there is shown a flowchart 500 implemented in the EBC circuitry 108. The method starts at 502 and proceeds to 504.

At 504, a 1D image block may be partitioned into a plurality of 1D image sub-blocks. The encoder circuitry 206 may be configured to partition the 1D image block, for example, a "16×1" image block, into a plurality of 1D image sub-blocks.

At 506, a sequential application of a 1D transform, followed by quantization, a residual prediction may be executed on the plurality of 1D image sub-blocks to generate a plurality of 1D sub-blocks of quantized-transformed residual levels. The encoder circuitry 206 may be configured to execute a sequential application of a 1D transform, followed by quantization, a residual prediction on the plurality of 1D image sub-blocks to generate a plurality of 1D sub-blocks of quantized-transformed residual levels.

At 508, a plurality of 1D sub-blocks of quantized-transformed residual levels may be stored for a 1D image block. The memory, such as the on-chip memory 204 or the external memory 110, may be configured to store the plurality of 1D sub-blocks of quantized-transformed residual levels for the 1D image block.

At 510, a maximum value of AC quantized-transformed residual level from a plurality of AC quantized-transformed residual levels may be compared to a first reference value for each 1D sub-block of the plurality of 1D sub-blocks. The encoder circuitry 206 may be configured to compare a maximum value of AC quantized-transformed residual level from a plurality of AC quantized-transformed residual levels to a first reference value for each 1D sub-block of the plurality of 1D sub-blocks.

At 512, a set of signaling bits may be allocated to each 1D sub-block of the plurality of 1D sub-blocks, based on the maximum value of AC quantized-transformed residual level of the plurality of AC quantized-transformed residual levels in each 1D sub-block of the plurality of 1D sub-blocks. The encoder circuitry 206 may be configured to allocate a set of signaling bits to each 1D sub-block of the plurality of 1D sub-blocks, based on the maximum value of AC quantized-transformed residual level of the plurality of AC quantized-transformed residual levels in each 1D sub-block of the plurality of 1D sub-blocks.

At 514, an entropy coding scheme, from a set of entropy coding schemes, may be selected for each 1D sub-block of the plurality of 1D sub-blocks, based on an allocated set of signaling bits for each 1D sub-block of the plurality of 1D sub-blocks. The encoder circuitry 206 may be configured to select an entropy coding scheme, from a set of entropy coding schemes, for each 1D sub-block of the plurality of 1D sub-blocks, based on an allocated set of signaling bits for each 1D sub-block of the plurality of 1D sub-blocks.

At 516, a DC quantized-transformed residual level of each 1D sub-block of the plurality of 1D sub-blocks, may be encoded in accordance with the selected entropy coding scheme. The encoder circuitry 206 may be configured to encode a DC quantized-transformed residual level of each 1D sub-block of the plurality of 1D sub-blocks, in accordance with the selected entropy coding scheme, e.g., a Huffman entropy coding scheme.

At 518, the plurality of AC quantized-transformed residual levels of a 1D sub-block associated with a first sub-block category, may be represented by the allocated set of signaling bits. The encoder circuitry 206 may be configured to represent the plurality of AC quantized-transformed residual levels of a 1D sub-block associated with a first sub-block category, by the allocated set of signaling bits.

At 520, an AC quantized-transformed residual level of the plurality of AC quantized-transformed residual levels of a 1D sub-block associated with the second sub-block category may be encoded using a single bit or a pair of bits, based on whether the AC quantized-transformed residual level is 0 or signed or unsigned 1. The encoder circuitry 206 may be configured to encode an AC quantized-transformed residual level of the plurality of AC quantized-transformed residual levels of a 1D sub-block, associated with the second sub-block category, using a single bit or a pair of bits, based on whether the AC quantized-transformed residual level is 0 or signed or unsigned 1.

At 522, the plurality of AC quantized-transformed residual levels of a 1D sub-block associated with the third sub-block category, may be encoded in accordance with the selected entropy coding scheme, e.g., a Huffman entropy coding scheme. The encoder circuitry 206 may be configured to encode the plurality of AC quantized-transformed residual levels of a 1D sub-block associated with the third sub-block category, in accordance with the selected entropy coding scheme, e.g., a Huffman entropy coding scheme. Control passes to end.

Certain embodiments of the disclosure may be found in an embedded codec (EBC) circuitry. Various embodiments of the disclosure may provide the EBC circuitry that may include a memory and an encoder circuitry communicatively coupled to the memory. The memory may be configured to store a plurality of one dimensional (1D) sub-blocks of quantized-transformed residual levels for a 1D image block. The encoder circuitry may be configured to allocate a set of signaling bits to each 1D sub-block of the plurality of 1D sub-blocks. The set of signaling bits may be allocated based on a maximum value of an AC quantized-transformed residual level from a plurality of AC quantized-transformed residual levels in each 1D sub-block of the plurality of 1D sub-blocks. The allocated set of signaling bits may be represent a sub-block category for each 1D sub-block of the plurality of 1D sub-blocks, from a set of sub-block categories. The set of signaling bits may be allocated to each 1D sub-block of the plurality of 1D sub-blocks such that a number of bits in the generated bit-stream of the encoded 1D image block may remain less than a bit budget specified for a specific compression ratio for the 1D image block. The encoder circuitry may be further configured to select an entropy coding scheme, from a set of entropy coding schemes, for each 1D sub-block of the plurality of 1D sub-blocks, based on the allocated set of signaling bits for each 1D sub-block. The encoder circuitry may be further configured to generate a bit-stream of encoded 1D image block by selective application of the entropy coding scheme on a DC quantized-transformed residual level, the plurality of AC quantized-transformed residual levels, or a combination of the DC quantized-transformed residual level and the plurality of AC quantized-transformed residual levels of each 1D sub-block of the plurality of 1D sub-blocks.

In accordance with an embodiment, the encoder circuitry may be further configured to execute a sequential encoding scheme on the 1D image block to generate the bit-stream of encoded 1D image block. The bit-stream of encoded 1D image block may include header information that indicates the sequential encoding scheme applied to encode the 1D image block to obtain the bit-stream of encoded 1D image block. The sequential encoding scheme may include a sequential application of a 1D transform, followed by quantization, a residual prediction, and the entropy coding scheme selected for each 1D sub-block of the plurality of 1D sub-blocks. A type of the 1D transform applied on the 1D image block may be based on a size of each 1D sub-block of the plurality of 1D sub-blocks. The size of each 1D sub-block of the plurality of 1D sub-blocks may be specified prior to encode of the 1D image block.

In accordance with an embodiment, the encoder circuitry may be further configured to compare the maximum value for each 1D sub-block of the plurality of 1D sub-blocks to a first reference value and a second reference value. The maximum value may be an absolute maximum value that is greater than or equal to 0. The comparison may determine whether the maximum value for each 1D sub-block of the plurality of 1D sub-blocks is equal to the first reference value, the second reference value, or greater than the second reference value. In certain embodiments, the first reference value is 0 and the second reference value is 1.

In accordance with an embodiment, the set of sub-block categories may include a first sub-block category, a second sub-block category, and a third sub-block category. Each sub-block category of the set of sub-block categories may indicate a different flatness level and a complexity level for a corresponding 1D sub-block of the plurality of 1D sub-blocks. In one instance, the allocated set of signaling bits may represent the first sub-block category, for a 1D sub-block of the plurality of 1D sub-blocks, when the maximum value of the plurality of AC quantized-transformed residual levels in the 1D sub-block is equal to the first reference value. In a second instance, the allocated set of signaling bits may represent the second sub-block category, for a 1D sub-block of the plurality of 1D sub-blocks, when the maximum value of the plurality of AC quantized-transformed residual levels in the 1D sub-block is equal to the second reference value. In a third instance, the allocated set of signaling bits may represent the third sub-block category, for a 1D sub-block of the plurality of 1D sub-blocks, when the maximum value of the plurality of AC quantized-transformed residual levels in the 1D sub-block is greater than the second reference value. In certain embodiments, a number of signaling bits in the allocated set of signaling bits to represent the first sub-block category is 1 and a number of signaling bits in the set of signaling bits to represent the second sub-block category and the third sub-block category is 2.

In accordance with an embodiment, the set of entropy coding schemes may include, but are not limited to, a Huffman coding scheme, an exponential Golomb coding scheme, a progressive Golomb coding scheme, a Golomb-Rice coding scheme, and a combination of the Huffman coding scheme and the exponential Golomb coding scheme. The encoder circuitry may be configured to encode the DC quantized-transformed residual level of each 1D sub-block of the plurality of 1D sub-blocks, in accordance with the selected entropy coding scheme. The plurality of AC quantized-transformed residual levels of a 1D sub-block associated with a first sub-block category may be represented by the allocated set of signaling bits such that a set of bits for the plurality of AC quantized-transformed residual levels may be directly decodable at a decoder circuitry using the allocated set of signaling bits.

In accordance with an embodiment, the encoder circuitry may be configured to encode, using a single bit, an AC quantized-transformed residual level of the plurality of AC quantized-transformed residual levels of a 1D sub-block associated with a second sub-block category. The AC quantized-transformed residual level may be encoded using the single bit when the AC quantized-transformed residual level is 0. Similarly, the encoder circuitry may be configured to encode, using a pair of bits, an AC quantized-transformed residual level of the plurality of AC quantized-transformed residual levels of a 1D sub-block associated with a second sub-block category. The AC quantized-transformed residual level may be encoded by the pair of bits when the AC quantized-transformed residual level is either unsigned 1 or signed 1. In accordance with an embodiment, the encoder circuitry may be further configured to encode the plurality of AC quantized-transformed residual levels of a 1D sub-block, associated with a third sub-block category, in accordance with the selected entropy coding scheme.

The present disclosure may be realized in hardware, or a combination of hardware and software. The present disclosure may be realized in a centralized fashion, in at least one computer system, or in a distributed fashion, where different elements may be spread across several interconnected computer systems. A computer system or other apparatus adapted for carrying out the methods described herein may be suited. A combination of hardware and software may be a general-purpose computer system with a computer program that, when loaded and executed, may control the computer system such that it carries out the methods described herein. The present disclosure may be realized in hardware that comprises a portion of an integrated circuit that also performs other functions.

The present disclosure may also be embedded in a computer program product, which comprises all the features enabling the implementation of the methods described herein, and which when loaded in a computer system is able to carry out these methods. Computer program, in the present context, means any expression, in any language, code or notation, of a set of instructions intended to cause a system having an information processing capability to perform a particular function either directly, or after either or both of the following: a) conversion to another language, code or notation; b) reproduction in a different material form.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. An embedded codec (EBC) circuitry, comprising:
   a memory configured to store a one dimensional (1D) image block; and
   encoder circuitry configured to:
   partition the 1D image block into a plurality of 1D sub-blocks;
   allocate a set of signaling bits to each 1D sub-block of the plurality of 1D sub-blocks, wherein,
   the allocation is based on a maximum value of an alternating current (AC) quantized-transformed residual level from a plurality of AC quantized-transformed residual levels in each 1D sub-block of the plurality of 1D sub-blocks, and each 1D sub-block of the plurality of 1D sub-blocks is classified into a sub-block category from a set of sub-block categories based on the allocated set of signaling bits;

select an entropy coding scheme, from a set of entropy coding schemes, for each 1D sub-block of the plurality of 1D sub-blocks, based on the allocated set of signaling bits for each 1D sub-block; and generate a bit-stream of encoded 1D image block by selective application of the entropy coding scheme on one of a direct current (DC) quantized-transformed residual level, the plurality of AC quantized-transformed residual levels, or a combination of the DC quantized-transformed residual level and the plurality of AC quantized-transformed residual levels of each 1D sub-block of the plurality of 1D sub-blocks.

2. The EBC circuitry according to claim 1, wherein the encoder circuitry is further configured to execute a sequential encoding scheme on the 1D image block to generate the bit-stream of encoded 1D image block.

3. The EBC circuitry according to claim 2, wherein
the bit-stream of encoded 1D image block comprises header information that indicates the sequential encoding scheme applied to encode the 1D image block to obtain the bit-stream of encoded 1D image block, and
the sequential encoding scheme comprises a sequential application of a 1D transform, followed by quantization, a residual prediction, and the entropy coding scheme selected for each 1D sub-block of plurality of 1D sub-blocks.

4. The EBC circuitry according to claim 3, wherein
a type of the 1D transform applied on the 1D image block is based on a size of each 1D sub-block of the plurality of 1D sub-blocks, and
the size of each 1D sub-block of the plurality of 1D sub-blocks is specified prior to encode of the 1D image block.

5. The EBC circuitry according to claim 1, wherein
the encoder circuitry is further configured to compare the maximum value for each 1D sub-block of the plurality of 1D sub-blocks to a first reference value and a second reference value,
the maximum value is one of greater than or equal to 0, and
the comparison determines whether the maximum value for each 1D sub-block of the plurality of 1D sub-blocks is one of equal to the first reference value, equal to the second reference value, or greater than the second reference value.

6. The EBC circuitry according to claim 5, wherein the first reference value is 0 and the second reference value is 1.

7. The EBC circuitry according to claim 5, wherein
the set of sub-block categories comprises a first sub-block category, a second sub-block category, and a third sub-block category, and
each sub-block category of the set of sub-block categories indicates a different flatness level and a different complexity level for a corresponding 1D sub-block of the plurality of 1D sub-blocks.

8. The EBC circuitry according to claim 7, wherein the allocated set of signaling bits represents the first sub-block category, for a 1D sub-block of the plurality of 1D sub-blocks, based on the maximum value of the plurality of AC quantized-transformed residual levels in the 1D sub-block that is equal to the first reference value.

9. The EBC circuitry according to claim 7, wherein the allocated set of signaling bits represents the second sub-block category, for a 1D sub-block of the plurality of 1D sub-blocks, based on the maximum value of the plurality of AC quantized-transformed residual levels in the 1D sub-block that is equal to the second reference value.

10. The EBC circuitry according to claim 7, wherein the allocated set of signaling bits represents the third sub-block category, for a 1D sub-block of the plurality of 1D sub-blocks, based on the maximum value of the plurality of AC quantized-transformed residual levels in the 1D sub-block that is greater than the second reference value.

11. The EBC circuitry according to claim 7, wherein a number of signaling bits in the allocated set of signaling bits to represent the first sub-block category is 1.

12. The EBC circuitry according to claim 7, wherein a number of signaling bits in the set of signaling bits to represent the second sub-block category and the third sub-block category is 2.

13. The EBC circuitry according to claim 1, wherein the set of entropy coding schemes comprises one of a Huffman coding scheme, an exponential Golomb coding scheme, a progressive Golomb coding scheme, or a Golomb-Rice coding scheme, or a combination of the Huffman coding scheme and the exponential Golomb coding scheme.

14. The EBC circuitry according to claim 1, wherein the encoder circuitry is further configured to encode the DC quantized-transformed residual level of each 1D sub-block of the plurality of 1D sub-blocks, in accordance with the selected entropy coding scheme.

15. The EBC circuitry according to claim 1, wherein the plurality of AC quantized-transformed residual levels of a 1D sub-block associated with a first sub-block category are represented by the allocated set of signaling bits such that a set of bits for the plurality of AC quantized-transformed residual levels are directly decodable at a decoder circuitry using the allocated set of signaling bits.

16. The EBC circuitry according to claim 1, wherein the set of signaling bits are allocated to each 1D sub-block of the plurality of 1D sub-blocks such that a number of bits in the generated bit-stream of encoded 1D image block is less than a bit budget specified for a specific compression ratio for the 1D image block.

17. The EBC circuitry according to claim 1, wherein
the encoder circuitry is further configured to encode, using a single bit, an AC quantized-transformed residual level of the plurality of AC quantized-transformed residual levels of a 1D sub-block associated with a second sub-block category, and
the AC quantized-transformed residual level is encoded using the single bit based on the AC quantized-transformed residual level that is 0.

18. The EBC circuitry according to claim 1, wherein
the encoder circuitry is further configured to encode, using a pair of bits, an AC quantized-transformed residual level of the plurality of AC quantized-transformed residual levels of a 1D sub-block associated with a second sub-block category, and
the AC quantized-transformed residual level is encoded by the pair of bits based on the AC quantized-transformed residual level that is one of unsigned 1 or signed 1.

19. The EBC circuitry according to claim 1, wherein the encoder circuitry is further configured to encode the plurality of AC quantized-transformed residual levels of a 1D sub-block, associated with a third sub-block category, in accordance with the selected entropy coding scheme.

20. The EBC circuitry according to claim 1, wherein a number of bits in the bit-stream of encoded 1D image block comprises a number of the allocated set of signaling bits for each 1D sub-block of the plurality of 1D sub-blocks.

21. A method comprising:
in an embedded codec (EBC) circuitry that comprises a memory and encoder circuitry:
partitioning, by the encoder circuitry, a one dimensional (1D) image block into a plurality of 1D sub-blocks;
storing, by the memory, the plurality of 1D sub-blocks;
allocating, by the encoder circuitry, a set of signaling bits to each 1D sub-block of the plurality of 1D sub-blocks, wherein,
the allocation based on a maximum value of an AC quantized-transformed residual level from a plurality of Alternating Current (AC) quantized-transformed residual levels in each 1D sub-block, and
each 1D sub-block of the plurality of 1D sub-blocks is classified into a sub-block category from a set of sub-block categories based on the allocated set of signaling bits;
selecting, by the encoder circuitry, an entropy coding scheme, from a set of entropy coding schemes, for each 1D sub-block of the plurality of 1D sub-blocks, based on the allocated set of signaling bits for each 1D sub-block; and
generating, by the encoder circuitry, a bit-stream of encoded 1D image block by selective application of the entropy coding scheme on one of a Direct Current (DC) quantized-transformed residual level, the plurality of AC quantized-transformed residual levels, or a combination of the DC quantized-transformed residual level and the plurality of AC quantized-transformed residual levels of each 1D sub-block of the plurality of 1D sub-blocks.

* * * * *